(12) United States Patent
Madraswala et al.

(10) Patent No.: US 11,923,016 B2
(45) Date of Patent: Mar. 5, 2024

(54) PROGRESSIVE PROGRAM SUSPEND RESUME

(71) Applicant: Intel Corporation, Santa Clara, CA (US)

(72) Inventors: Aliasgar S. Madraswala, Folsom, CA (US); Sagar Upadhyay, Folsom, CA (US); Jiantao Zhou, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 647 days.

(21) Appl. No.: 17/033,082

(22) Filed: Sep. 25, 2020

(65) Prior Publication Data

US 2022/0101927 A1    Mar. 31, 2022

(51) Int. Cl.
*G11C 16/26* (2006.01)
*G06F 3/06* (2006.01)
*G11C 16/10* (2006.01)
*G11C 16/34* (2006.01)

(52) U.S. Cl.
CPC ............ *G11C 16/26* (2013.01); *G06F 3/0611* (2013.01); *G11C 16/10* (2013.01); *G11C 16/3431* (2013.01); *G11C 16/3495* (2013.01)

(58) Field of Classification Search
CPC ..... G11C 16/26; G11C 16/10; G11C 16/3431; G11C 16/3495; G06F 3/0611
See application file for complete search history.

(56) References Cited

U.S. PATENT DOCUMENTS

| | | | | |
|---|---|---|---|---|
| 9,851,905 | B1* | 12/2017 | Ramalingam | G06F 3/0685 |
| 9,892,794 | B2* | 2/2018 | Micheloni | G11C 16/0408 |
| 10,540,115 | B2* | 1/2020 | Zang | G06F 3/0679 |
| 11,513,722 | B2* | 11/2022 | Kim | G06F 3/0629 |
| 11,626,163 | B2* | 4/2023 | Bates | G06F 3/0679 711/103 |
| 2018/0024772 | A1* | 1/2018 | Madraswala | G06F 3/0679 711/103 |
| 2023/0214147 | A1* | 7/2023 | Chodem | G06F 3/0679 711/164 |

* cited by examiner

*Primary Examiner* — Son L Mai
(74) *Attorney, Agent, or Firm* — Jordan IP Law, LLC

(57) ABSTRACT

Systems, apparatuses and methods may provide for technology that resumes a program operation with respect to NAND memory during a first tier in response to a suspension counter reaching a first threshold and resumes the program operation with respect to the NAND memory during a second tier in response to the suspension counter reaching a second threshold. The technology may also resume the program operation with respect to the NAND memory during a third tier in response to the suspension counter reaching a third threshold. Additionally, the technology may service one or more read operations with respect to the NAND memory until the suspension counter reaches the first threshold during the first tier, until the suspension counter reaches the second threshold during the second tier, and until the suspension counter reaches the third threshold during the third tier.

18 Claims, 7 Drawing Sheets

PROGRESSIVE PROGRAM SUSPEND RESUME

TECHNICAL FIELD

Embodiments generally relate to memory structures. More particularly, embodiments relate to the use of progressive program suspend resume in memory structures to enhance performance.

BACKGROUND

On NAND memory, there are three primary operations (Read, Program, and Erase). The latency of read operations is typically much less than the latency of program operations and erase operations. To improve read QoS (quality of service) latency, features such as program suspend and erase suspend may be enabled on NAND memory so that when a read request is encountered while a program/erase operation is ongoing, the program/erase operation can be suspended to prioritize the read operation. The suspended program/erase operation may later be resumed to completion.

NAND memory may allow limited number of suspends (e.g., 60 suspends) on a program page to minimize any negative impact on RBER (residual bit error rate). In heavy read intensive workloads, the NAND device may exhaust the suspends in the initial time period of the program operation (e.g., 1-2 milliseconds of a 16-threshold voltage distribution program operation for a quad-level cell NAND). Once all of the suspends are exhausted, read requests may not be processed until the program operation is finished, which may lead to high read QoS latency.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
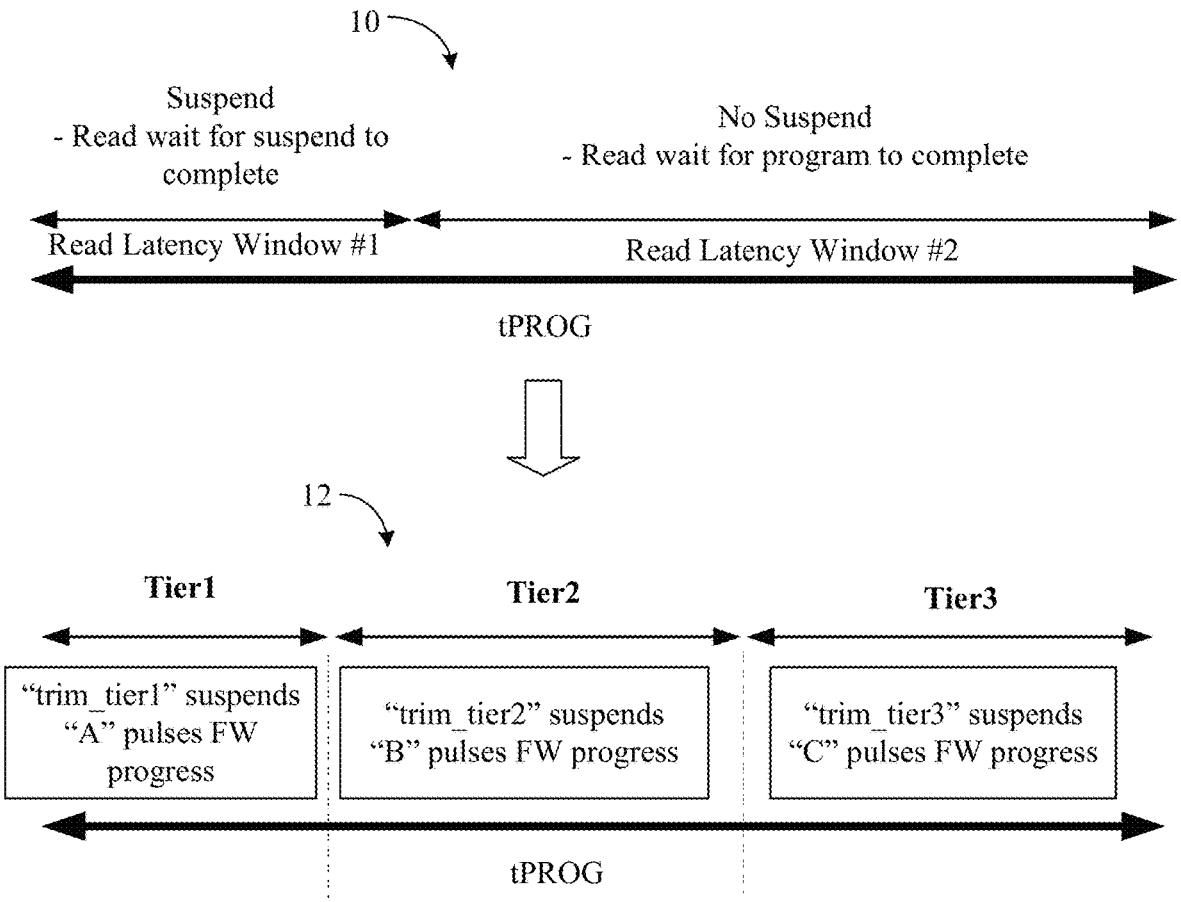
FIG. 1 is a comparative illustration of an example of a conventional program time period and a program time period according to an embodiment.

Turning now to FIG. 1, a conventional program time period 10 "tPROG" demonstrates the time taken to complete the programming of bits into a NAND memory array. In the illustrated example, during a Read Latency Window #1, the NAND memory has program suspend commands/instances ("suspends") available to serve read requests. Accordingly, any read request encountered in this window would experience a relatively short QoS latency. During a Read Latency Window #2, however, the NAND memory has exhausted all of the available program suspends. Therefore, any read requests encountered in this window are forced to wait until completion of the remaining tPROG. As a result, the read requests in the Read Latency Window #2 will experience a relatively long QoS latency. Read wait times for suspends to complete are approximately 80 microseconds to 250 microseconds depending on at which point of the programming sequence a suspend is issued, while read wait times for a program operation to complete may be as high as 4 milliseconds. Longer read wait times may essentially degrade the read latency by a considerable factor and have a negative impact on performance.

By contrast, an enhanced program time period 12 "tPROG" uses Progressive Program Suspend Resume as a method to divide the tPROG into multiple tiers (e.g., time windows) based on the number of suspends used and modulate forward progress of the programming sequence for each of those tiers. Moreover, the first tier may be configured with "no forward progress", which allows the lowest possible read QoS latency to be achieved while operating in Tier 1. Using parameters such as "suspend count tier" and "number of pulses of forward progress" for each tier, the NAND device can distribute the total suspends across the entire tPROG, leaving no exhausted non-suspendable tPROG pulses. Additionally, each tier may be configured based on the application and workload to achieve an improved read QoS.

Compared to conventional Program Suspend Resume, Progressive Program Suspend Resume (PPSR) helps modulate the progress of the programming sequence. For read intensive workloads, such an approach ensures that NAND programming is not "starving" to make progress due to multiple suspends being issued in a short interval of time. The PPSR technology described herein also improves read QoS latency because it enables lower percentile read latency to be traded off with higher percentile read latency. For example, PPSR will start showing read latency improvement from 99.9% (i.e., three 9 s) and higher (e.g., read latency due to ECC recovery+program suspend is <500 microseconds). Data shows that up to 60% read latency improvement at the $99.99^{th}$ percentile may be traded off with down to 50% read latency deterioration at the $90^{th}$ percentile. Embodiments also provide more configurability to set tiers and forward progress differently for different workloads to achieve a better QoS.

Figure 2:
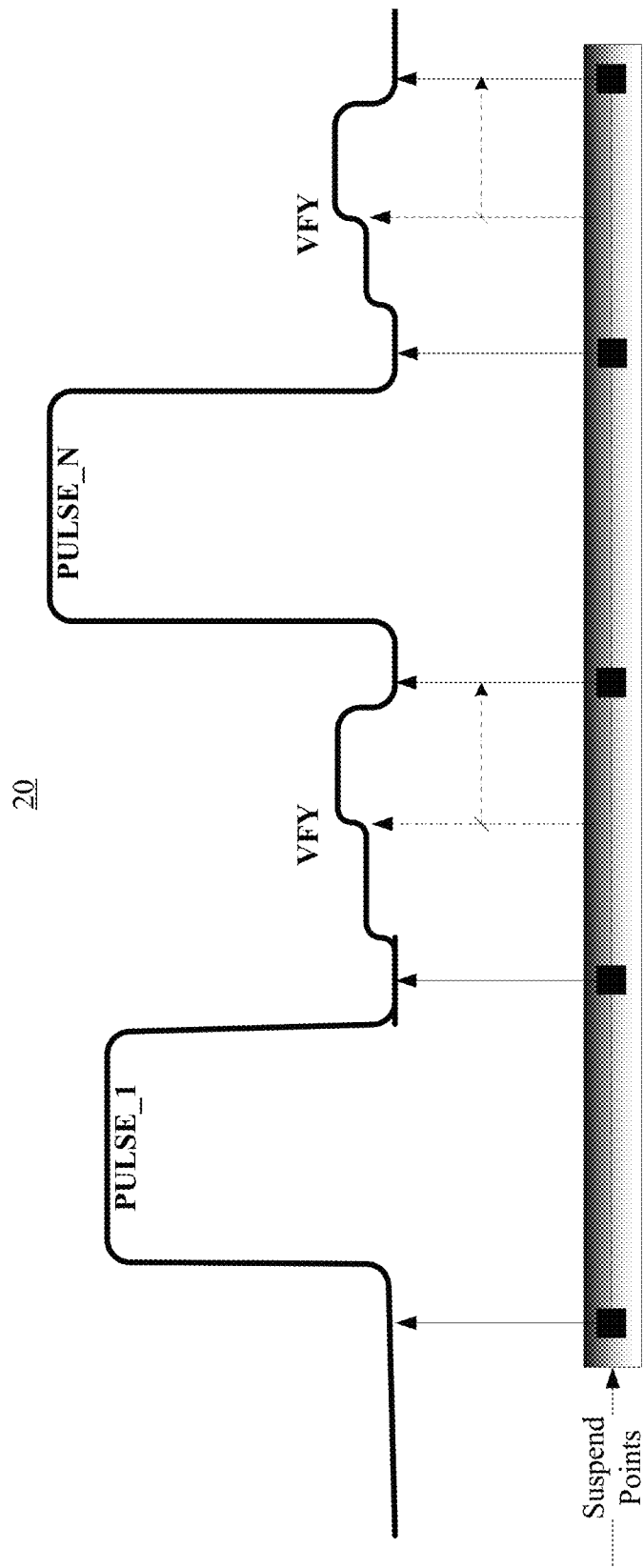
FIG. 2 is a plot of an example of a program pulse sequence according to an embodiment.

FIG. 2 shows a program pulse sequence 20 having different suspend points. In general, programming on a NAND device may be achieved by applying series of program pulses (PULSE_1, PULSE_N) with an increasing magnitude to the control gate of the NAND cells. In an embodiment, each programming pulse is followed by a series of verify pulses ("verifies") to compare the Vt (threshold voltage) of the multi-bit per NAND cell against the program verify voltage/level to ensure that the cells are programmed at the targeted levels. The illustrated programming sequence has several suspend points from which the NAND device can suspend the ongoing program, service the read operations ("reads"), and then resume/continue the programming.

The non-volatile memory can comprise a block addressable memory device, such as NAND, or more specifically, multi-threshold level NAND Flash memory (for example, Single-Level Cell ("SLC"), Multi-Level Cell ("MLC"), Quad-Level Cell ("QLC"), Tri-Level Cell ("TLC"), or some other NAND). The NAND Flash cell uses the threshold voltage of a floating-gate transistor to represent the data stored in the cell.

The NAND flash cell uses the threshold voltage of a floating-gate transistor to represent the data stored in the cell. In a SLC NAND flash memory, each memory cell has two voltage levels corresponding to two states (0, 1) to represent one bit. In a MLC, TLC and QLC NAND flash memory, each memory cell stores more than one bit. Each cell in a MLC NAND Flash memory uses four voltage levels corresponding to four states (00, 01, 10, 11) to represent 2 bits of binary data. Each cell in a TLC NAND Flash memory uses eight voltage levels corresponding to eight states (000 to 111) to represent 3 bits of binary data. Each cell in a QLC NAND Flash memory uses sixteen voltage levels corresponding to sixteen states (0000 to 1111) to represent 4 bits of binary data.

With regard to Penta-Level Cell (PLC), five bits means five possible values for each cell. NAND built around floating gates may have floating-gate cells that offer larger and more reliable read windows between each cell. Accordingly, it may be easier to increase density with floating-gate cells as QLC density increases.

Figure 3:
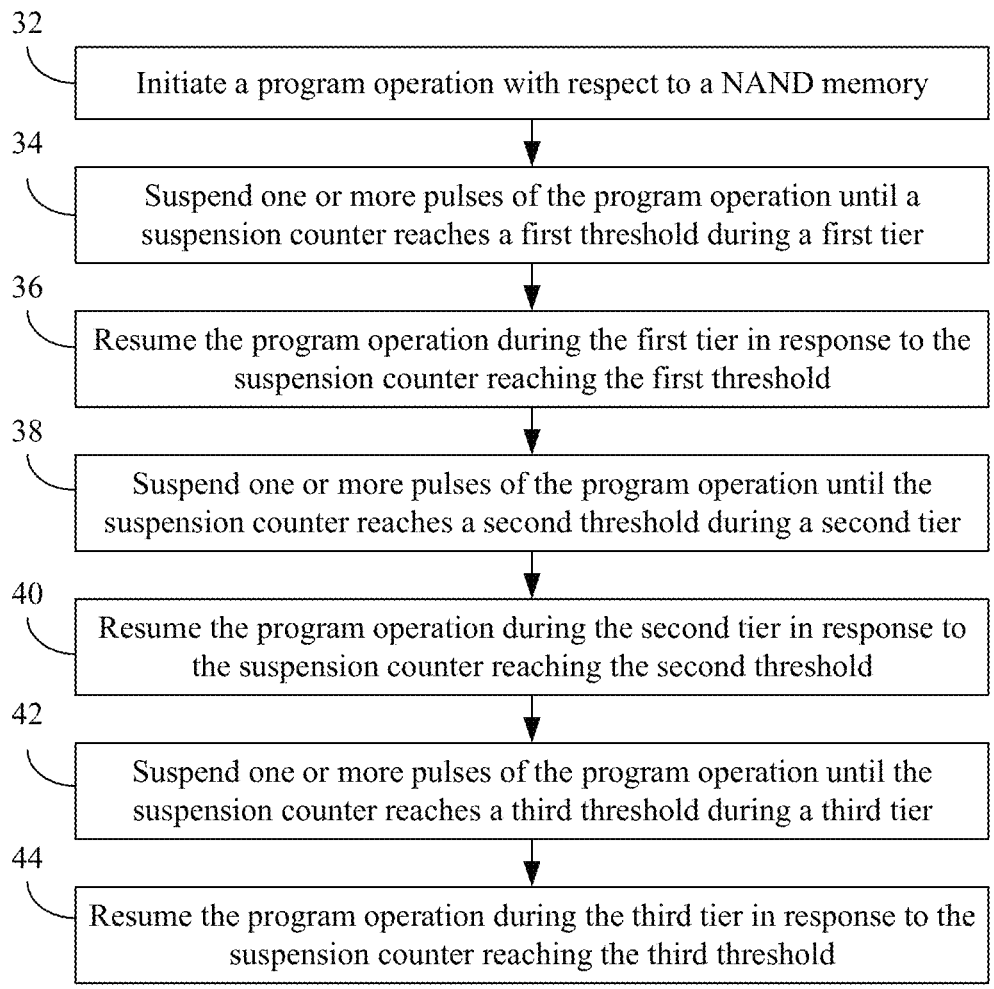
FIG. 3 is a flowchart of an example of a method of operating performance-enhanced control logic according to an embodiment.

FIG. 3 shows a method 30 of operating performance-enhanced control logic. The method 30 may generally be implemented in control logic of a NAND device. More particularly, the method 30 may be implemented in one or more modules as a set of logic instructions stored in a machine- or computer-readable storage medium such as random access memory (RAM), ROM, programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 30 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 32 initiates a program operation with respect to a NAND (e.g., non-volatile) memory. In one example, block 34 suspends one or more pulses of the program operation until a suspension counter reaches a first threshold (e.g., pulse threshold "trim setting") during a first tier. The suspension counter may generally track the number of suspension instances ("suspends"), which may be limited for a given program operation. In an embodiment, block 34 also provides for servicing one or more read operations with respect to the NAND memory until the suspension counter reaches the first threshold during the first tier. Block 36 may resume the program operation during the first tier in response to the suspension counter reaching the first threshold.

In an embodiment, block 38 suspends one or more pulses of the program operation until the suspension counter reaches a second threshold during a second tier, where block 38 may also provide for servicing one or more read operations with respect to the NAND memory until the suspension counter reaches the second threshold during the second tier. Block 40 resumes the program operation during the second tier in response to the suspension counter reaching the second threshold. Illustrated block 42 provides for suspending one or more pulses of the program operation until the suspension counter reaches a third threshold during a third tier. In an embodiment, block 42 also provides for servicing one or more read operations with respect to the NAND memory until the suspension counter reaches the third threshold during the third tier. Block 44 may resume the program operation during the third tier in response to the suspension counter reaching the third threshold. Although the illustrated example uses three tiers, two or more tiers (e.g., 2 . . . N) may be used depending on the circumstances (e.g., number of bits per NAND cell such as triple-level cell/TLC, quad-level cell/QLC, etc.).

As already noted, resumption of the program operation during the first tier at block 36, the second tier at block 40, and the third tier at block 44 may prevent a limited number of suspension commands from being exhausted, which enhances performance. Performance may be further enhanced by defining the first threshold, the second threshold, and the third threshold based on one or more of application information or workload information. The thresholds may be defined by a command protocol to change configurations in a NAND device or a set feature interface command protocol.

Figure 4A:
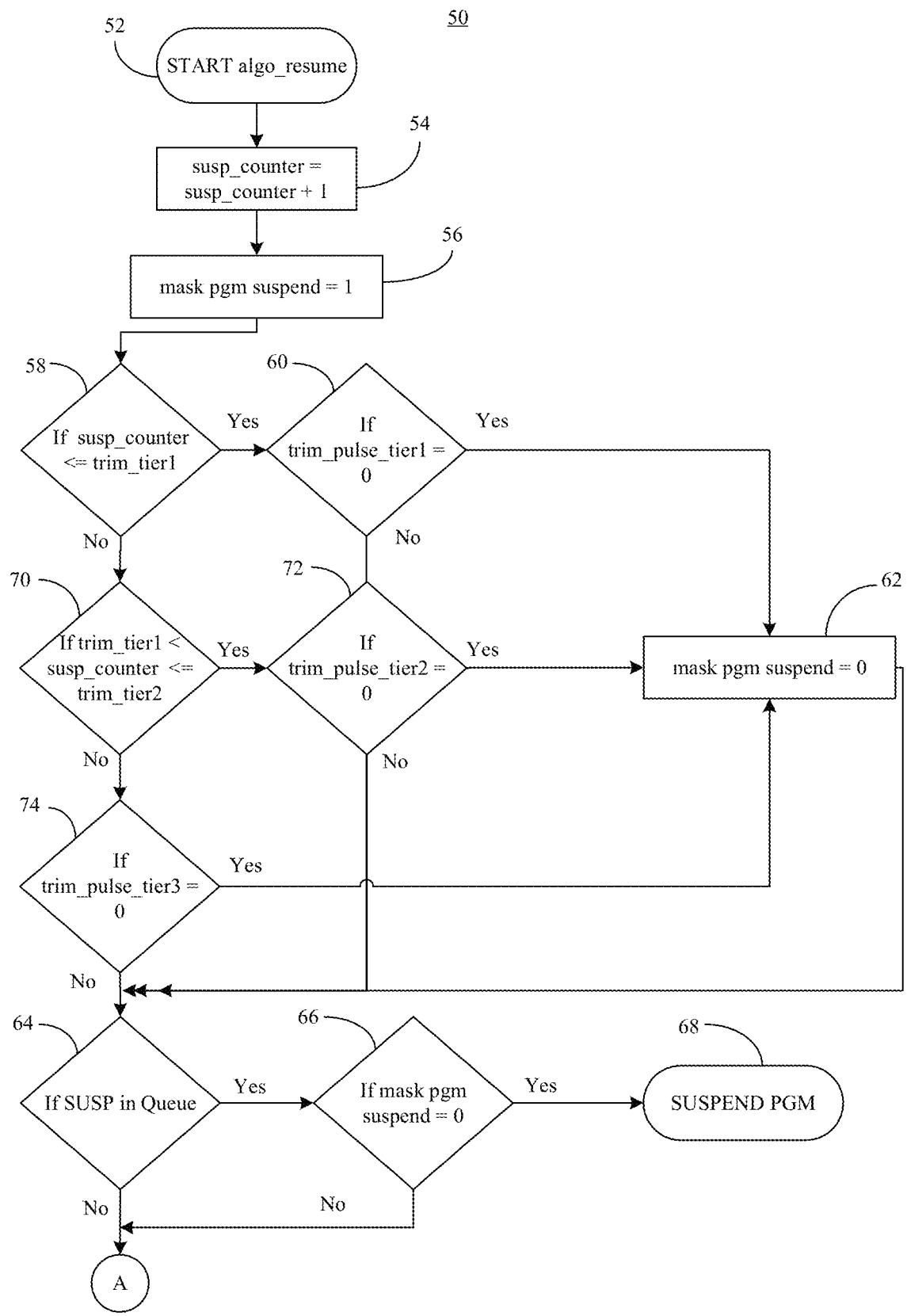
FIGS. 4A and 4B are flowcharts of an example of a more detailed method of operating performance-enhanced control logic according to an embodiment.
Figure 4B:
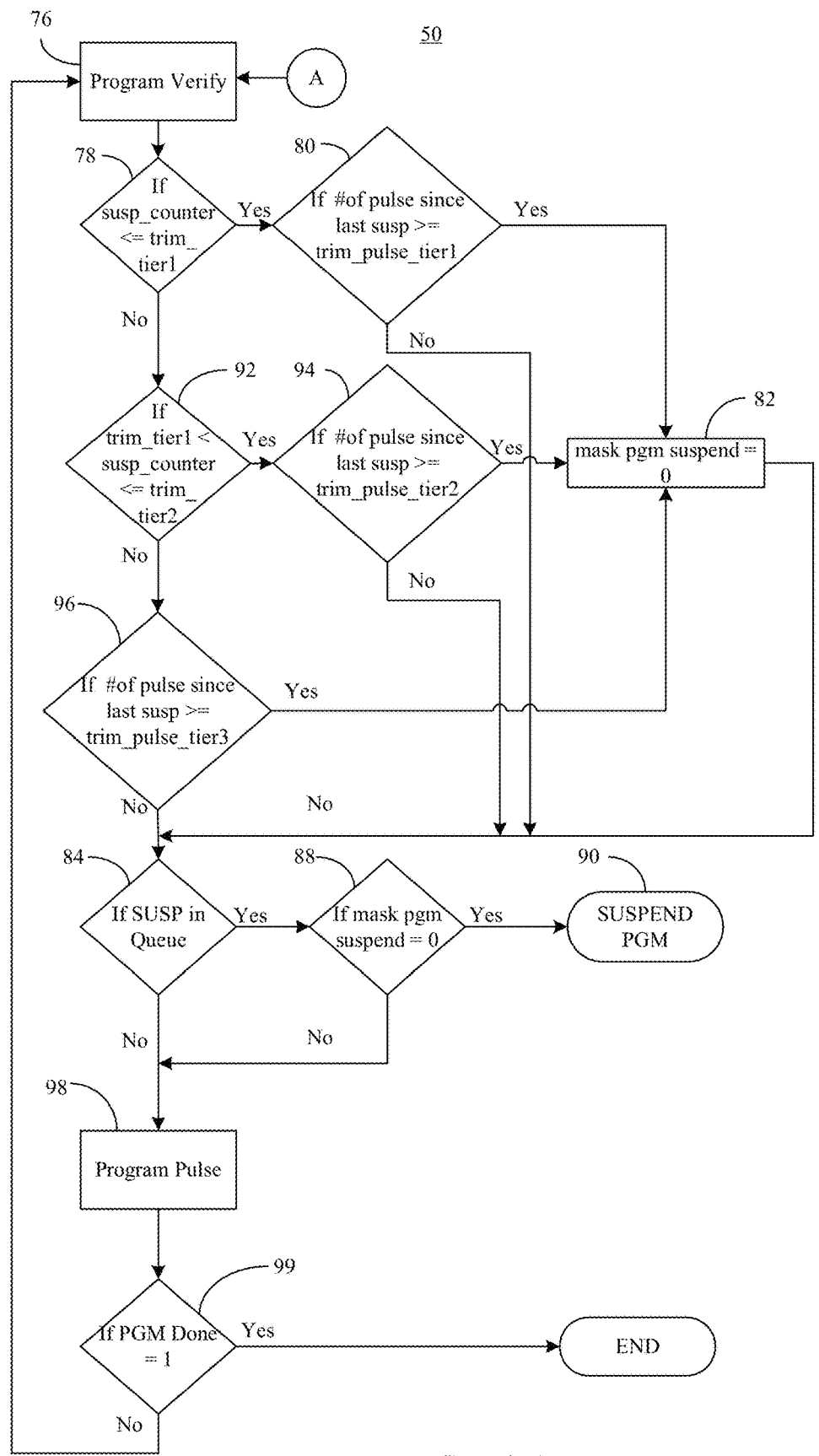

FIGS. 4A and 4B show a more detailed method 50 of operating a memory controller and/or control logic in a NAND device. The method 50 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

In general, embodiments use pre-defined trim settings to (1) differentiate among three tiers in terms of number of program suspends, and (2) allocate number of pulse(s) of forward progress for each tiers. Once an ongoing program is suspended to prioritize read requests, when read operations in a queue (e.g., software queue of the system) are complete, a host (e.g., system controller) may resume the program. In an embodiment, a resume command to the NAND device is issued by a system controller and a resume operation on the NAND device is controlled by control logic in the NAND device. A record of the number of suspends is kept by incrementing a counter upon the resume, where the next suspend is masked until further checks for masking/unmasking of a suspend are performed. Depending on the suspend tier and the number of pulses that have made forward progress for that tier, the PPSR technology either keeps the suspend masked or unmasks the suspend.

If (a) the next suspend has already been issued by the system/host and suspend is masked by the PPSR technology, then suspend points during the program-verify are ignored, and if (b) suspend is unmasked, then the next suspend point that detects the suspend, executes the program-suspend and frees up the NAND to prioritize read requests. In case of (a), the programming sequence continues with the program pulse and another check is performed to update suspend mask/unmask information based on the trim settings for the current tier and number of pulses that have made forward progress. This pulse-verify loop, along with the PPSR suspend mask/unmask check may be performed and depending on whether a suspend is in the queue and the PPSR trim settings, the control logic proceeds with the program suspend or program completion, leaving no exhausting tPROG without available suspends behind. In an embodiment, trim settings are configuration parameters that are initialized during power-on of the NAND device and stored in an SRAM (static random access memory) external to the NAND device.

Illustrated processing block 52 starts the resumption procedure, where block 54 increments a suspension counter. In one example, a program suspend mask is set to one at block 56. Block 58 may determine whether the suspension counter is less than or equal to a first tier threshold ("trim_tier1"). If so, block 60 determines whether a first pulse threshold ("trim_pulse_tier1") is zero. If so, the program suspend mask is set to zero at block 62 and the method 50 proceeds to block 64, which determines whether any suspends are in a queue. If so, block 66 determines whether the program suspend mask is zero. If so, block 68 suspends the programming sequence.

If it is determined at block 58 that the suspension counter is not less than or equal to the first tier threshold, illustrated block 70 determines whether the suspension counter is between the first tier threshold and a second threshold ("trim_tier2"). If so, block 72 may determine whether a second pulse threshold ("trim_pulse_tier2") is zero, if so, the program suspend mask is set to zero at block 62 and the method 50 proceeds to block 64.

If it is determined at block 70 that the suspension counter is not between the first tier threshold and the second tier threshold, block 74 may determine whether a third pulse threshold ("trim_pulse_tier3") is zero. If so, the program suspend mask is set to zero and the method 50 proceeds to block 64. If it is determined at block 60 that the first tier threshold is not zero, the method 50 proceeds to block 72. If it is determined at block 72 that the second tier threshold is not zero, the method 50 proceeds to block 64. Similarly, if it is determined at block 74 that the third tier threshold is not zero, the method 50 proceeds to block 64. If it is determined either at block 66 that the program suspend mask is not zero or at block 64 that there are no suspends in the queue, illustrated block 76 conducts a program verify.

In an embodiment, block 78 determines whether the suspension counter is less than the first tier threshold. If so, a determination may be made at block 80 as to whether the number of pulses since the last suspend exceeds the first pulse threshold. If so, illustrated block 82 sets the program suspend mask to zero and the method 50 proceeds to block 84, which determines whether any suspends are in the queue. If so, block 88 determines whether the program suspend mask is zero. If the program suspend mask is zero, block 90 suspends the programming sequence.

If it is determined at block 78 that the suspension counter is not less than the first threshold, block 92 determines whether the suspension counter is between the first tier threshold and the second tier threshold. If so, block 94 determines whether the number of pulses since the last suspend exceeds the second pulse threshold. If so, illustrated block 82 sets the program suspend mask to zero and the method 50 proceeds to block 84.

If it is determined at block 92 that the suspension counter is not between the first tier threshold and the second tier threshold, block 96 determines whether the number of pulses since the last suspend exceeds the third pulse threshold. If so, illustrated block 82 sets the program suspend mask to zero and the method 50 proceeds to block 84. Otherwise, the method proceeds to block 84.

If it is determined at block 80 that the number of pulses since the last suspend does not exceed the first pulse threshold, the method 50 proceeds to block 84. Similarly, if it is determined at block 94 that the number of pulses since the last suspend does not exceed the second pulse threshold, the method 50 proceeds to block 84. If it is determined either at block 88 that the program suspend mask is not zero or at block 84 that there are no suspends in the queue, illustrated block 98 issues a program pulse. If it is determined at block 99 that the program sequence is complete, the illustrated method 50 terminates. Otherwise, the method 50 may return to block 76. The method 50 therefore provides the flexibility to control suspend-resume throughout the entire tPROG. Accordingly, host/system controller may achieve better read QoS among different workloads.

Figure 5:
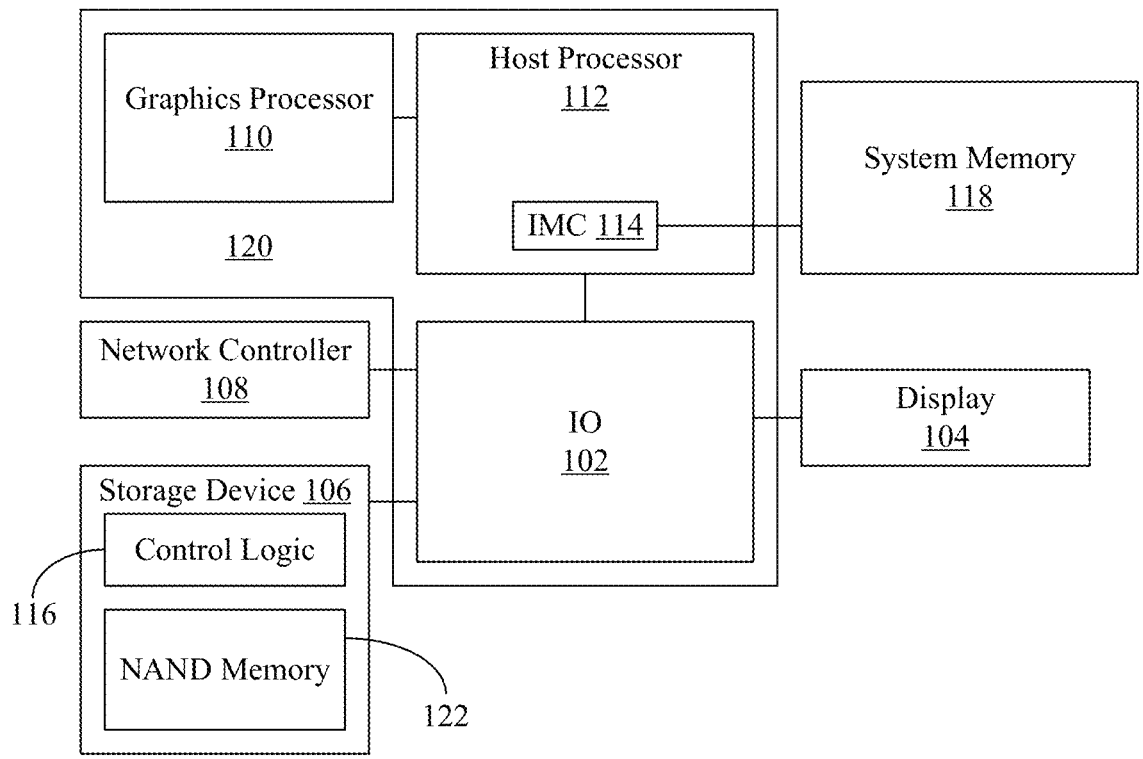
FIG. 5 is a block diagram of an example of a performance-enhanced computing system according to an embodiment.

FIG. 5 shows a performance-enhanced computing system 100. The system 100 may be part of a server, desktop computer, notebook computer, tablet computer, convertible tablet, smart television (TV), personal digital assistant (PDA), mobile Internet device (MID), smart phone, wearable device, media player, vehicle, robot, Internet of Things (IoT) component, etc., or any combination thereof. In the illustrated example, an input/output (10) module 102 is communicatively coupled to a display 104 (e.g., liquid crystal display/LCD, light emitting diode/LED display, touch screen), storage device 106 (e.g., flash memory, hard disk drive/HDD, optical disc, solid-state drive/SSD), and a network controller 108 (e.g., wired, wireless).

The system 100 may also include a graphics processor 110, a host processor 112 (e.g., CPU), and an integrated memory controller (IMC) 114, wherein the illustrated IMC 114 communicates with a system memory 118 over a bus or other suitable communication interface. The host processor 112, the graphics processor 110, the IMC 114, and the 10 module 102 are integrated onto a shared semiconductor die 120 in a system on chip (SoC) architecture. In an embodiment, the storage device 106 includes control logic 116 (e.g., logic instructions, configurable hardware, fixed-functionality hardware, etc., or any combination thereof) and NAND memory 122.

The illustrated control logic 116 implements one or more aspects of the method 30 (FIG. 3) and/or the method 50 (FIGS. 4A and 4B), already discussed. Thus, the control logic 116 may resume a program operation with respect to the NAND memory 122 during a first tier (e.g., time window) in response to a suspension counter reaching a first threshold and resume the program operation with respect to the NAND memory 122 during a second tier in response to the suspension counter reaching a second threshold. In an embodiment, an external memory controller (not shown) triggers operations on the storage device 106 based on commands issued and internal operations on the storage device 106 are performed by the internal control logic 116 of the storage device 106. Additionally, the control logic 116 may resume the program operation with respect to the NAND memory during a third tier in response to the suspension counter reaching a third threshold. Moreover, the control logic 116 may service one or more read operations with respect to the NAND memory until the suspension counter reaches the first threshold during the first tier, until the suspension counter reaches the second threshold during the second tier, and until the suspension counter reaches the third threshold during the third tier.

In one example, resumption of the program operation during the first tier, the second tier, and the third tier prevents a limited number of suspension commands from being exhausted. Additionally, the control logic 116 may define the first threshold, the second threshold and/or the third threshold based on one or more of application information or workload information.

In an embodiment, the storage device 106 is a memory structure that may include non-volatile memory and/or volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The term "storage device" may refer to the die itself and/or to a packaged memory product. In some embodiments, 3D crosspoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD235, JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

Figure 6:
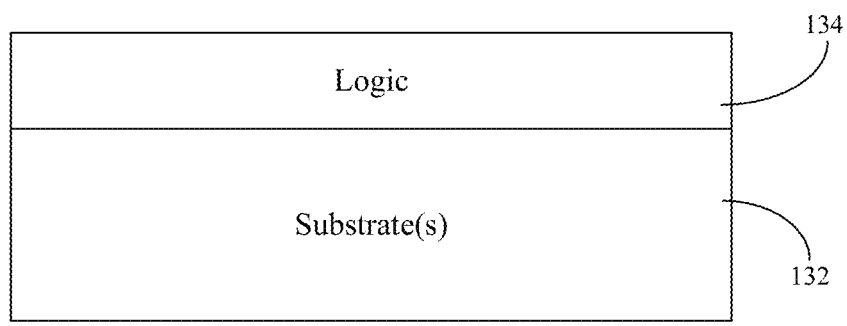
FIG. 6 is an illustration of an example of a semiconductor package apparatus according to an embodiment.

FIG. 6 shows a semiconductor apparatus 130 (e.g., chip, die) that includes one or more substrates 132 (e.g., silicon, sapphire, gallium arsenide) and logic 134 (e.g., transistor array and other integrated circuit/IC components) coupled to the substrate(s) 132. The logic 134, which may be implemented at least partly in configurable logic and/or fixed-functionality hardware logic, may generally implement one or more aspects of the method 30 (FIG. 3) and/or the method 50 (FIGS. 4A and 4B), already discussed.

In one example, the logic 134 includes transistor channel regions that are positioned (e.g., embedded) within the substrate(s) 132. Thus, the interface between the logic 134 and the substrate(s) 132 may not be an abrupt junction. The logic 134 may also be considered to include an epitaxial layer that is grown on an initial wafer of the substrate(s) 132.

Figure 7:
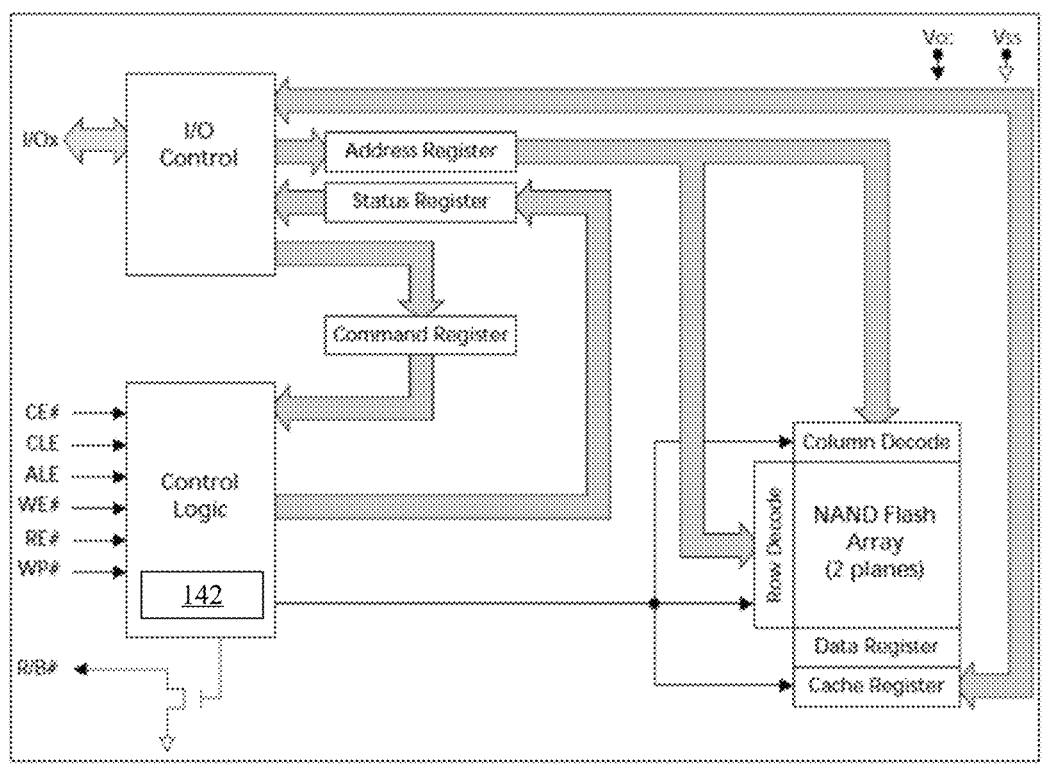
FIG. 7 is a block diagram of an example of a memory device according to an embodiment.

FIG. 7 shows a memory device 140 that includes control logic, I/O control, and a NAND flash array (e.g., NAND memory). In the illustrated example, the control logic includes instructions 142 that generally implement one or more aspects of the method 30 (FIG. 3) and/or the method 50 (FIGS. 4A and 4B), already discussed.

ADDITIONAL NOTES AND EXAMPLES

Example 1 includes a memory device comprising NAND memory and logic coupled to one or more substrates, wherein the logic is at least partly implemented in one or more of configurable or fixed-functionality hardware, and the logic coupled to the one or more substrates is to resume a program operation with respect to the NAND memory during a first tier in response to a suspension counter reaching a first threshold, resume the program operation with respect to the NAND memory during a second tier in response to the suspension counter reaching a second threshold, resume the program operation with respect to the NAND memory during a third tier in response to the suspension counter reaching a third threshold, and service one or more read operations with respect to the NAND memory until the suspension counter reaches the first threshold during the first tier, until the suspension counter reaches the second threshold during the second tier, and until the suspension counter reaches the third threshold during the third tier.

Example 2 includes the memory device of Example 1, wherein resumption of the program operation during the first tier, the second tier, and the third tier is to prevent a limited number of suspension commands from being exhausted.

Example 3 includes the memory device of Example 1, wherein the logic coupled to the one or more substrates is to suspend one or more program pulses of the program operation until the suspension counter reaches the first threshold during first tier.

Example 4 includes the memory device of Example 1, wherein the logic coupled to the one or more substrates is to suspend one or more program pulses of the program operation until the suspension counter reaches the second threshold during the second tier.

Example 5 includes the memory device of Example 1, wherein the logic coupled to the one or more substrates is to suspend one or more program pulses of the program operation until the suspension counter reaches the third threshold during the third tier.

Example 6 includes the memory device of any one of Examples 1 to 5, wherein the logic coupled to the one or more substrates is to define the first threshold, the second threshold, and the third threshold based on one or more of application information or workload information.

Example 7 includes a computing system comprising a system on chip (SoC) and a storage device coupled to the SoC, the storage device including control logic and a NAND memory coupled to the control logic, the control logic to resume a program operation with respect to the NAND memory during a first tier in response to a suspension counter reaching a first threshold, resume the program operation with respect to the NAND memory during a second tier in response to the suspension counter reaching a second threshold, resume the program operation with respect to the NAND memory during a third tier in response to the suspension counter reaching a third threshold, and service one or more read operations with respect to the NAND memory until the suspension counter reaches the first threshold during the first tier, until the suspension counter reaches the second threshold during the second tier, and until the suspension counter reaches the third threshold during the third tier.

Example 8 includes the computing system of Example 7, wherein resumption of the program operation during the first tier, the second tier, and the third tier is to prevent a limited number of suspension commands from being exhausted.

Example 9 includes the computing system of Example 7, wherein the control logic is to suspend one or more program pulses of the program operation until the suspension counter reaches the first threshold during first tier.

Example 10 includes the computing system of Example 7, wherein the control logic is to suspend one or more program pulses of the program operation until the suspension counter reaches the second threshold during the second tier.

Example 11 includes the computing system of Example 7, wherein the control logic is to suspend one or more program pulses of the program operation until the suspension counter reaches the third threshold during the third tier.

Example 12 includes the computing system of any one of Examples 7 to 11, wherein the control logic is to define the first threshold, the second threshold, and the third threshold based on one or more of application information or workload information.

Example 13 includes a method of operating a NAND device, the method comprising resuming a program operation with respect to a NAND memory during a first tier in response to a suspension counter reaching a first threshold, resuming the program operation with respect to the NAND memory during a second tier in response to the suspension counter reaching a second threshold, resuming the program operation with respect to the NAND memory during a third tier in response to the suspension counter reaching a third threshold, and servicing one or more read operations with respect to the NAND memory until the suspension counter reaches the first threshold during the first tier, until the suspension counter reaches the second threshold during the second tier, and until the suspension counter reaches the third threshold during the third tier.

Example 14 includes the method of Example 13, wherein resumption of the program operation during the first tier, the second tier, and the third tier prevents a limited number of suspension commands from being exhausted.

Example 15 includes the method of Example 13, further including suspending one or more program pulses of the program operation until the suspension counter reaches the first threshold during first tier.

Example 16 includes the method of Example 13, further including suspending one or more program pulses of the program operation until the suspension counter reaches the second threshold during the second tier.

Example 17 includes the method of Example 13, further including suspending one or more program pulses of the program operation until the suspension counter reaches the third threshold during the third tier.

Example 18 includes the method of Example 13, further including defining the first threshold, the second threshold, and the third threshold based on one or more of application information or workload information.

Example 19 includes means for performing the method of any one of Examples 13 to 18.

If program suspend resume commands are continuously issued to NAND memory, the technology described herein may prevent suspend latency increases being indicated through ready/busy pins or status read pins. Additionally, the enablement of the technology described herein (e.g., number of suspend points in each tier, expected latency) may be described in 3D NAND design data sheets.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory device comprising:
NAND memory; and
logic coupled to one or more substrates, wherein the logic is at least partly implemented in one or more of configurable or fixed-functionality hardware, and the logic coupled to the one or more substrates is to:
resume a program operation with respect to the NAND memory during a first tier in response to a suspension counter reaching a first threshold;
resume the program operation with respect to the NAND memory during a second tier in response to the suspension counter reaching a second threshold;
resume the program operation with respect to the NAND memory during a third tier in response to the suspension counter reaching a third threshold; and
service one or more read operations with respect to the NAND memory until the suspension counter reaches the first threshold during the first tier, until the suspension counter reaches the second threshold during the second tier, and until the suspension counter reaches the third threshold during the third tier.

2. The memory device of claim 1, wherein resumption of the program operation during the first tier, the second tier, and the third tier is to prevent a limited number of suspension commands from being exhausted.

3. The memory device of claim 1, wherein the logic coupled to the one or more substrates is to suspend one or more program pulses of the program operation until the suspension counter reaches the first threshold during first tier.

4. The memory device of claim 1, wherein the logic coupled to the one or more substrates is to suspend one or more program pulses of the program operation until suspension counter reaches the second threshold during the second tier.

5. The memory device of claim 1, wherein the logic coupled to the one or more substrates is to suspend one or more program pulses of the program operation until suspension counter reaches the third threshold during the third tier.

6. The memory device of claim 1, wherein the logic coupled to the one or more substrates is to define the first threshold, the second threshold, and the third threshold based on one or more of application information or workload information.

7. A computing system comprising:
a system on chip (SoC); and
a storage device coupled to the SoC, the storage device including control logic and a NAND memory coupled to the control logic, the control logic to:
resume a program operation with respect to the NAND memory during a first tier in response to a suspension counter reaching a first threshold,
resume the program operation with respect to the NAND memory during a second tier in response to the suspension counter reaching a second threshold,
resume the program operation with respect to the NAND memory during a third tier in response to the suspension counter reaching a third threshold, and
service one or more read operations with respect to the NAND memory until the suspension counter reaches the first threshold during the first tier, until the suspension counter reaches the second threshold during the second tier, and until the suspension counter reaches the third threshold during the third tier.

8. The computing system of claim 7, wherein resumption of the program operation during the first tier, the second tier, and the third tier is to prevent a limited number of suspension commands from being exhausted.

9. The computing system of claim 7, wherein the control logic is to suspend one or more program pulses of the program operation until the suspension counter reaches the first threshold during first tier.

10. The computing system of claim 7, wherein the control logic is to suspend one or more program pulses of the program operation until the suspension counter reaches the second threshold during the second tier.

11. The computing system of claim 7, wherein the control logic is to suspend one or more program pulses of the program operation until the suspension counter reaches the third threshold during the third tier.

12. The computing system of claim 7, wherein the control logic is to define the first threshold, the second threshold, and the third threshold based on one or more of application information or workload information.

13. A method of operating a NAND device, comprising:
resuming a program operation with respect to a NAND memory during a first tier in response to a suspension counter reaching a first threshold;
resuming the program operation with respect to the NAND memory during a second tier in response to the suspension counter reaching a second threshold;
resuming the program operation with respect to the NAND memory during a third tier in response to the suspension counter reaching a third threshold; and
servicing one or more read operations with respect to the NAND memory until the suspension counter reaches the first threshold during the first tier, until the suspension counter reaches the second threshold during the second tier, and until the suspension counter reaches the third threshold during the third tier.

14. The method of claim 13, wherein resumption of the program operation during the first tier, the second tier, and the third tier prevents a limited number of suspension commands from being exhausted.

15. The method of claim 13, further including suspending one or more program pulses of the program operation until the suspension counter reaches the first threshold during first tier.

16. The method of claim 13, further including suspending one or more program pulses of the program operation until the suspension counter reaches the second threshold during the second tier.

17. The method of claim 13, further including suspending one or more program pulses of the program operation until the suspension counter reaches the third threshold during the third tier.

18. The method of claim 13, further including defining the first threshold, the second threshold, and the third threshold based on one or more of application information or workload information.

* * * * *